US009679821B2

(12) United States Patent
Jung et al.

(10) Patent No.: US 9,679,821 B2
(45) Date of Patent: Jun. 13, 2017

(54) METHODS OF REVISING OVERLAY CORRECTION DATA

(71) Applicant: Samsung Electronics Co., Ltd., Suwon-si (KR)

(72) Inventors: Woojin Jung, Seoul (KR); Sang-Ho Yun, Yongin-si (KR); Un Jeon, Seoul (KR); Byeongsoo Kim, Hwaseong-si (KR); Cheolhong Kim, Yongin-si (KR); Taehong Min, Suwon-si (KR); Joonsoo Park, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/001,729

(22) Filed: Jan. 20, 2016

(65) Prior Publication Data

US 2016/0351455 A1    Dec. 1, 2016

(30) Foreign Application Priority Data

May 26, 2015  (KR) ........................ 10-2015-0073070

(51) Int. Cl.
*H01L 21/66*    (2006.01)
*H01L 21/027*   (2006.01)
(Continued)

(52) U.S. Cl.
CPC ............ *H01L 22/12* (2013.01); *G01B 11/002* (2013.01); *G01B 11/272* (2013.01); *G03F 7/70633* (2013.01); *H01L 21/0274* (2013.01)

(58) Field of Classification Search
CPC ......... H01L 22/12; H01L 22/24; H01L 22/10; H01L 22/14; H01L 21/0274
See application file for complete search history.

(56) References Cited

U.S. PATENT DOCUMENTS 6,389,366 B1 *   5/2002   Heavlin ............... G01R 31/311
                                              438/21

6,574,524 B2 *   6/2003   Kim .................... G03F 7/70633
                                              356/401

(Continued)

FOREIGN PATENT DOCUMENTS

KR       20050098438       10/2005

OTHER PUBLICATIONS

Chue et al. "Optimization of alignment/overlay sampling and marker layout to improve overlay performance for double patterning technology". Lithography Asia 2009, Proc. of SPIE vol. 7520 pp. 75200G-1-7500G-12.

(Continued)

*Primary Examiner* — Thomas L Dickey
*Assistant Examiner* — Damon Hillman
(74) *Attorney, Agent, or Firm* — Onello & Mello LLP

(57) ABSTRACT

Provided are methods of generating and revising overlay correction data, a method of performing a photolithography process using the overlay correction data, and a method of performing a photolithography process while revising the overlay correction data. The method of revising the overlay correction data includes forming a plurality of overlay keys on a first set of wafers using first overlay correction data, measuring first overlay keys formed on first overlay coordinates in a first shot area of a first wafer among the first set of wafers, generating first overlay error data, and revising primarily the first overlay correction data using the first overlay error data, measuring second overlay keys formed on second overlay coordinates in a second shot area of a second wafer among the first set of wafers, generating second overlay error data, and revising secondarily the primarily revised first overlay correction data using the second overlay error data, and measuring third overlay keys formed on third overlay coordinates in a third shot area of a third wafer among the first set of wafers, generating third overlay error data, revising tertiarily the secondarily revised first overlay correction data, and generating second overlay correction data. The first overlay coordinates, the second overlay coordinates, and the third overlay coordinates are mutually exclusive.

15 Claims, 18 Drawing Sheets

(51) Int. Cl.
*G01B 11/27* (2006.01)
*G01B 11/00* (2006.01)
*G03F 7/20* (2006.01)

(56) References Cited

U.S. PATENT DOCUMENTS

| | | |
|---|---|---|
| 7,586,609 B2 | 9/2009 | Lin et al. |
| 7,847,939 B2 | 12/2010 | Smith et al. |
| 2014/0240703 A1 | 8/2014 | Lee et al. |
| 2014/0278213 A1 | 9/2014 | Hsieh et al. |
| 2015/0012255 A1* | 1/2015 | Li .......................... G05B 17/02 703/6 |

OTHER PUBLICATIONS

Koay et al. Automated optimized overlay sampling for high-order processing in double patterning lithography. Metrology, Inspection, and Process Control for Microlithography XXIV, Proc. of SPIE vol. 7638, pp. 76381R-1-76381R-10.

McKay et al. "A Comparison of Three Methods for Selecting Values of Unput Variables in the Analysis of Output From a Computer Code". Tehnometric, Feb. 2000, vol. 42, No. 1, pp. 55-61.

* cited by examiner

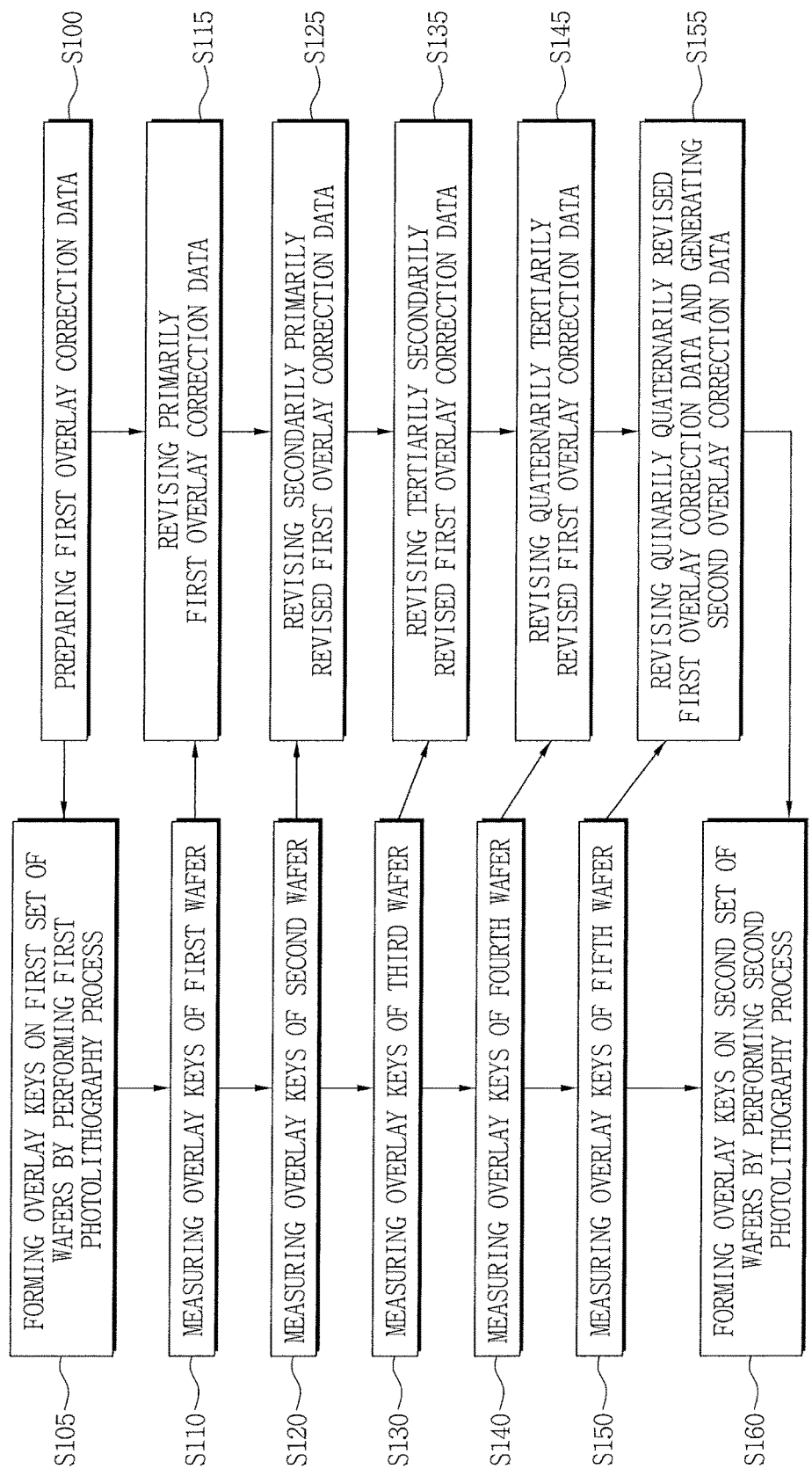

METHODS OF REVISING OVERLAY CORRECTION DATA

CROSS-REFERENCE TO RELATED APPLICATION

This application claims priority under 35 U.S.C. §119 to Korean Patent Application No. 10-2015-0073070 filed on May 26, 2015, the disclosure of which is hereby incorporated by reference in its entirety.

BACKGROUND

Field

Inventive concepts relate to methods of generating and revising overlay correction data, a method of performing a photolithography process using the overlay correction data, and a method of performing a photolithography process while revising the overlay correction data.

Description of Related Art

As semiconductor devices are miniaturized, it becomes increasingly difficult to precisely arrange patterns in photolithography processes for manufacturing the semiconductor devices. An overlay process in which lower patterns disposed in a lower layer and upper patterns disposed in an upper layer are vertically arranged may prove increasingly difficult to implement as semiconductor device dimension decrease.

SUMMARY

Exemplary embodiments of inventive concepts provide methods of generating and revising overlay correction data.

Exemplary embodiments of inventive concepts provide methods of performing a photolithography process using the overlay correction data.

Exemplary embodiments of inventive concepts provide methods of performing a photolithography process while revising the overlay correction data.

In exemplary embodiments in accordance with principles of inventive concepts, a method of revising overlay correction data includes preparing a plurality of wafers each having a plurality of overlay coordinates in a plurality of shot areas, wherein the plurality of shot areas include a first shot area group and a second shot area group, which are mutually exclusive, the overlay coordinates include a first overlay coordinate group and a second overlay coordinate group, which are mutually exclusive, and the wafers include a first wafer group and a second wafer group, which are mutually exclusive, forming overlay keys on the overlay coordinates in the shot areas of the wafers by performing a photolithography process using first overlay correction data, selecting a first wafer from the first wafer group, measuring first overlay errors of the overlay keys on the first overlay coordinates in the shot areas of the first shot area group on the first wafer, and revising primarily the first overlay correction data using the first overlay errors, and selecting a second wafer from the second wafer group, measuring second overlay errors of the overlay keys on the second overlay coordinates in the shot areas of the second shot area group on the second wafer, and revising secondarily the primarily revised first overlay correction data using the second overlay errors.

In exemplary embodiments in accordance with principles of inventive concepts a first shot area group and the second shot area group may include the shot areas which are mutually exclusive.

In exemplary embodiments in accordance with principles of inventive concepts a plurality of overlay coordinates may be each disposed at intersections on different rows and different columns.

In exemplary embodiments in accordance with principles of inventive concepts a plurality of overlay coordinates may be uniformly disposed in the shot areas using a Latin hypercube sampling method so as to have a maximized dispersion without overlap or bias.

In exemplary embodiments in accordance with principles of inventive concepts a plurality of shot areas may further include a third shot area group exclusive from the first and second shot areas. The overlay coordinates may further include a third overlay coordinate group exclusive from the first and second overlay coordinate groups. The wafers may further include a third wafer group exclusive from the first and second wafer groups.

In exemplary embodiments in accordance with principles of inventive concepts a method may further include selecting a third wafer from the third wafer group, measuring third overlay errors of the overlay keys on the third overlay coordinates in the shot areas of the third shot area group, and revising tertiarily the secondarily revised first overlay correction data using the third overlay errors.

In exemplary embodiments in accordance with principles of inventive concepts a plurality of shot areas may further include a fourth shot area group exclusive from the first to third shot areas. The overlay coordinates may further include a fourth overlay coordinate group exclusive from the first to third overlay coordinate groups. The wafers may further include a fourth wafer group exclusive from the first to third wafer groups. The method may further include selecting a fourth wafer from the fourth wafer group, measuring fourth overlay errors of the overlay keys on the fourth overlay coordinates in the shot areas of the fourth shot area group, and revising quaternarily the tertiarily revised first overlay correction data using the fourth overlay errors.

In exemplary embodiments in accordance with principles of inventive concepts a plurality of shot areas may further include a fifth shot area group exclusive from the first to fourth shot areas. The overlay coordinates may further include a fifth overlay coordinate group exclusive from the first to fourth overlay coordinate groups. The wafers may further include a fifth wafer group exclusive from the first to fourth wafer groups. The method may further include selecting a fifth wafer from the fifth wafer group, measuring fifth overlay errors of the overlay keys on the fifth overlay coordinates in the shot areas of the fifth shot area group, revising quinarily the quaternarily revised first overlay correction data using the fifth overlay errors, and generating second overlay correction data.

In exemplary embodiments in accordance with principles of inventive concepts a first to fifth wafer groups may each include one lot of wafers. The first to fifth wafers each may be one selected from the one lot of wafers.

In exemplary embodiments in accordance with principles of inventive concepts a sum of the first to fifth shot areas may include the entire shot areas on the wafers.

In exemplary embodiments in accordance with principles of inventive concepts a sum of the first to fifth overlay coordinate groups may include the entire overlay coordinates in the entire shot areas.

In exemplary embodiments in accordance with principles of inventive concepts, a method of revising overlay correction data includes forming a plurality of overlay keys on a first set of wafers using first overlay correction data, measuring first overlay keys formed on first overlay coordinates in a first shot area of a first wafer among the first set of wafers, generating first overlay error data, and revising primarily the first overlay correction data using the first overlay error data, measuring second overlay keys formed on second overlay coordinates in a second shot area of a second wafer among the first set of wafers, generating second overlay error data, and revising secondarily the primarily revised first overlay correction data using the second overlay error data, and measuring third overlay keys formed on third overlay coordinates in a third shot area of a third wafer among the first set of wafers, generating third overlay error data, revising tertiarily the secondarily revised first overlay correction data, and generating second overlay correction data. The first overlay coordinates, the second overlay coordinates, and the third overlay coordinates are mutually exclusive.

In exemplary embodiments in accordance with principles of inventive concepts a first wafer may be one in a first wafer group having a plurality of wafers. The second wafer may be one in a second wafer group having a plurality of wafers. The third wafer may be one in a third wafer group having a plurality of wafers.

In exemplary embodiments in accordance with principles of inventive concepts a first shot area, the second shot area, and the third shot area may be mutually exclusive.

In exemplary embodiments in accordance with principles of inventive concepts a method may further include excluding outliers from each overlay error data using a kriging method before the second overlay correction data is generated.

In exemplary embodiments in accordance with principles of inventive concepts a method may further include measuring fourth overlay keys formed on fourth overlay coordinates in a fourth shot area of a fourth wafer among the first set of wafers, generating fourth overlay error data, and revising quaternarily the tertiarily revised first overlay correction data using the fourth overlay error data, and measuring fifth overlay keys formed on fifth overlay coordinates in a fifth shot area of a fifth wafer among the first set of wafers, generating fifth overlay error data, revising quinarily the quaternarily revised first overlay correction data using the fifth overlay error data, and generating second overlay correction data. The first overlay coordinates to the fifth overlay coordinates may be mutually exclusive.

In exemplary embodiments in accordance with principles of inventive concepts, a method of revising overlay correction data includes forming overlay keys on a first wafer, a second wafer, a third wafer, a fourth wafer, and a fifth wafer by performing a photolithography process using first overlay correction data, wherein the overlay keys include first overlay keys, second overlay keys, third overlay keys, fourth overlay keys, and fifth overlay keys disposed on mutually exclusive coordinates, measuring the first overlay keys on the first wafer and generating first overlay error data, measuring the second overlay keys on the second wafer and generating second overlay error data, measuring the third overlay keys on the third wafer and generating third overlay error data, measuring the fourth overlay keys on the fourth wafer and generating fourth overlay error data, measuring the fifth overlay keys on the fifth wafer and generating fifth overlay error data, and revising the first overlay correction data using the first to fifth overlay error data and generating second overlay correction data.

In exemplary embodiments in accordance with principles of inventive concepts a first to fifth overlay keys may be disposed in first to fifth shot areas, respectively, which are mutually exclusive.

In exemplary embodiments in accordance with principles of inventive concepts a first to fifth shot areas may be disposed on the first to fifth wafers, respectively, which are mutually exclusive.

In exemplary embodiments in accordance with principles of inventive concepts a first to fifth wafers may each be one selected from first to fifth lots of wafers which are mutually exclusive.

In exemplary embodiments in accordance with principles of inventive concepts a first to fifth lots of wafers each may include 25 wafers.

In exemplary embodiments in accordance with principles of inventive concepts, a method of performing a semiconductor manufacturing process includes performing a photolithography process on a group of wafers using overlay correction data using overlay keys on overlay coordinates in shot areas of a wafer; measuring overlay errors in a first group of wafers and revising overlay correction data using the measured overlay errors; and measuring overlay errors in a second group of the wafers and revising the previously-revised overlay correction data, wherein revising correction data includes removing outliers from overlay error data using an interpolation process.

In exemplary embodiments in accordance with principles of inventive concepts, a method of performing a semiconductor manufacturing process includes an interpolation process that is Gaussian process regression.

In exemplary embodiments in accordance with principles of inventive concepts, a method of performing a semiconductor manufacturing process includes an interpolation process that is Kriging process.

In exemplary embodiments in accordance with principles of inventive concepts, a method of performing a semiconductor manufacturing process includes a revision process that is continuously employed.

In exemplary embodiments in accordance with principles of inventive concepts, a method of performing a semiconductor manufacturing process includes overlay keys that are formed on overlay coordinates in mutually exclusive shot areas.

BRIEF DESCRIPTION OF THE DRAWINGS

The foregoing and other features and advantages of inventive concepts will be apparent from the more particular description of preferred embodiments of inventive concepts, as illustrated in the accompanying drawings in which like reference characters refer to the same parts throughout the different views. The drawings are not necessarily to scale, emphasis instead being placed upon illustrating the principles of inventive concepts. In the drawings:

FIG. 1 is a flowchart for describing a method of revising overlay correction data in accordance with an embodiment of inventive concepts;

DETAILED DESCRIPTION OF THE EMBODIMENTS

Figure 2A:
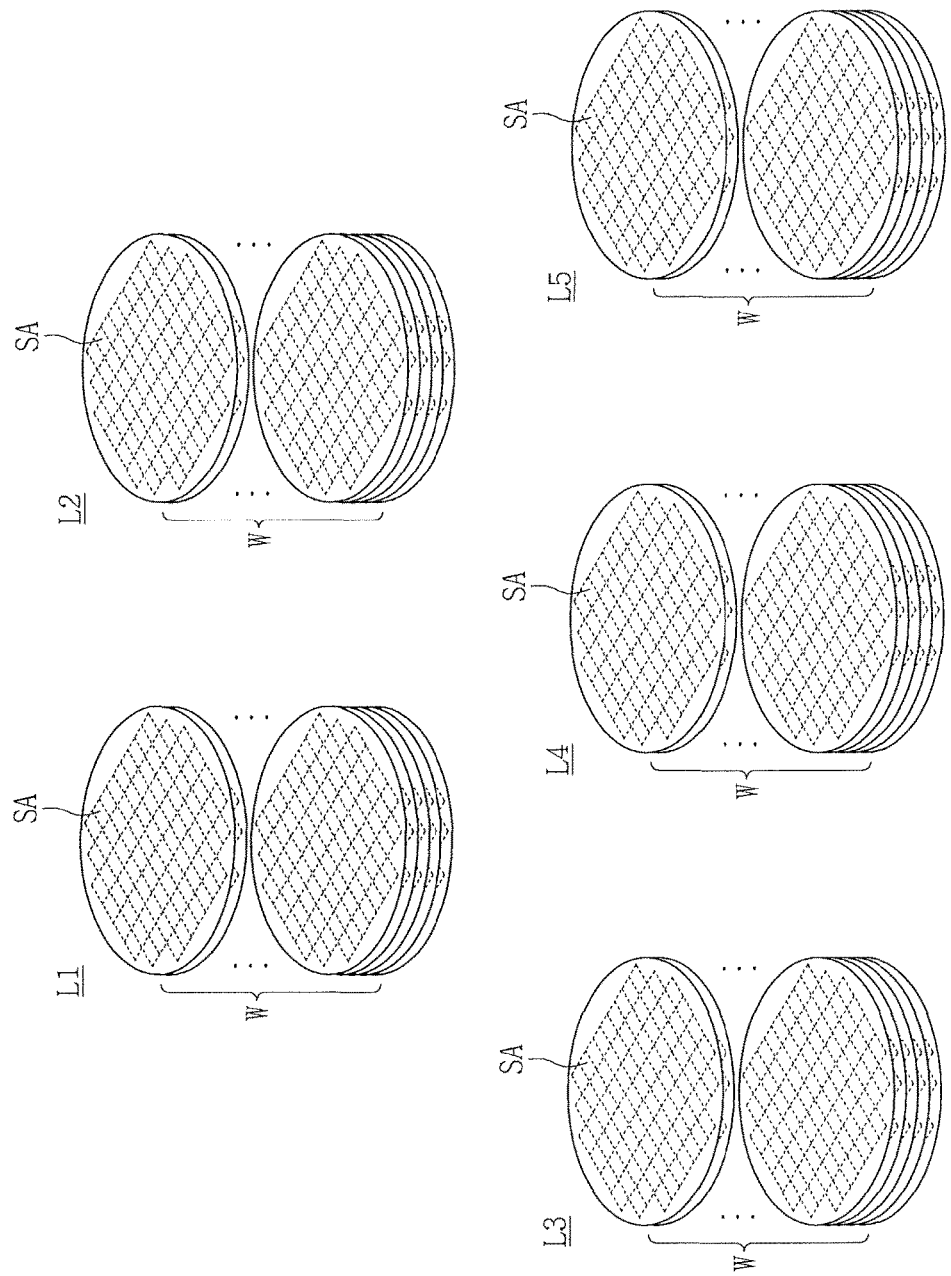
FIG. 2A is a view showing a plurality of wafers and wafer groups and FIG. 2B is a view showing shot areas of one of the wafers.

Advantages and features of inventive concepts and methods of accomplishing them will be made apparent with reference to the accompanying drawings and some embodiments to be described below. Inventive concepts may, however, be embodied in various different forms, and should be construed as defined, not by the embodiments set forth herein, but only by the accompanying claims. Rather, these embodiments are provided so that this disclosure is thorough and complete and fully conveys inventive concepts to those skilled in the art.

The terminology used herein is for the purpose of describing particular embodiments only and is not intended to be limiting of the present inventive concept. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on," "connected to," or "coupled to" another element or layer, it can be directly on, connected or coupled to the other element or layer or intervening elements or layers may be present. In contrast, when an element is referred to as being "directly on," "directly connected to," or "directly coupled to" another element or layer, there are no intervening elements or layers present. Like reference numerals throughout this specification denote like elements. As used herein, the term "and/or" includes any and all combinations of one or more of the associated listed items.

Spatially relative terms, such as "beneath," "below," "lower," "above," "upper," and the like, may be used herein for ease of description in describing one element's or feature's relationship to another/other element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features.

Exemplary embodiments of inventive concepts will be described with reference to cross-sectional views and/or plan views, which are ideal exemplary views. Thicknesses of layers and areas are exaggerated for effective description of the technical contents in the drawings. Forms of the embodiments may be modified by the manufacturing technology and/or tolerance. Therefore, the embodiments of inventive concepts are not intended to be limited to illustrated specific forms, but include modifications of forms generated according to manufacturing processes. For example, an etching area illustrated at a right angle may be round or have a predetermined curvature. Therefore, areas illustrated in the drawings have overview properties, and shapes of the illustrated areas exemplify special forms of the areas of a device, and are not intended to limit the scope of the inventive concepts.

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

FIG. 1 is a flowchart for describing an exemplary embodiment of a method of revising overlay correction data in accordance with principles of inventive concepts. FIGS. 2A and 2B to 11 are schematic views illustrating exemplary embodiments of methods of revising overlay correction data according to principles of inventive concepts.

Figure 2B:
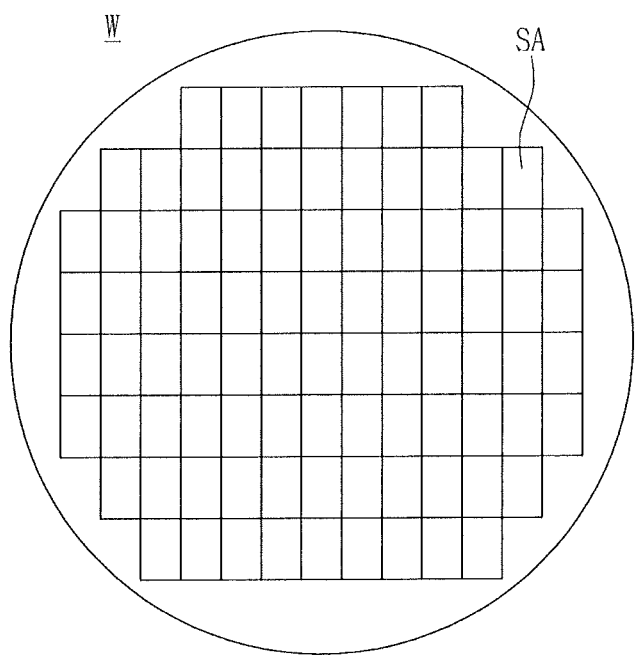

FIG. 2A is a view showing a plurality of wafers W and wafer groups L1 to L5 and FIG. 2B is a view showing shot areas SA of one of the wafers W.

Referring to FIGS. 1, 2A, and 2B, a method of revising overlay correction data in accordance with an exemplary embodiment in accordance with principles of inventive concepts may include preparing first overlay correction data, providing a first set of wafers W (S100), and processing the first set of wafers W by performing a first photolithography process using the first overlay correction data (S105).

The first set of wafers W may include a plurality of wafer groups, for example, first to fifth wafer groups L1 to L5. The wafer groups L1 to L5 may each include one lot of 25 wafers, and the first set of wafers W may include a total of 125 wafers W (that is, five wafer groups L1-L5 of 25 wafers each).

The wafers W may each have a plurality of shot areas SA. Each of the plurality of shot areas SA may be an area exposed by a single exposure process. For example, when one wafer W has 90 shot areas SA, 90 exposure processes may be performed on the wafer W. Each of the plurality of shot areas SA may include one chip area or a plurality of chip areas. In exemplary embodiments in accordance with principles of inventive concepts, one shot area SA is one chip area. Scribe lanes may be disposed between the chip areas in the shot areas SA. In exemplary embodiments, with each of the shot areas SA assumed to have one chip area, solid lines, which define the shot areas SA, correspond to scribe lanes.

A first photolithography process may include a first exposure process and a first developing process. The first exposure process may include transferring optical patterns onto wafers W having photoresist layers thereon using first overlay correction data in an exposure apparatus. The first developing process may include developing the photoresist layers on the exposed wafers W to form photoresist patterns on the wafers W.

Figure 3A:
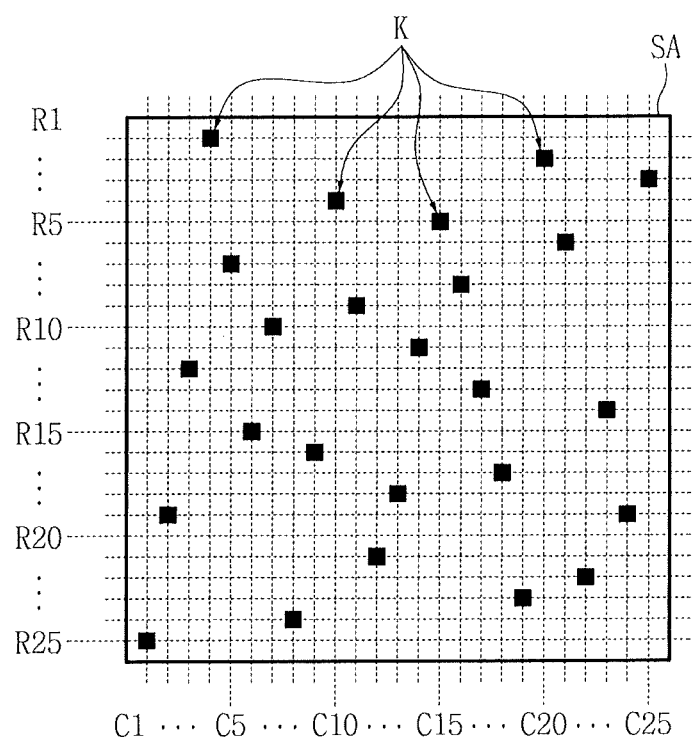
FIGS. 3A and 3B are enlarged views showing one of the shot areas of the wafers shown in FIGS. 2A and 2B.
Figure 3B:
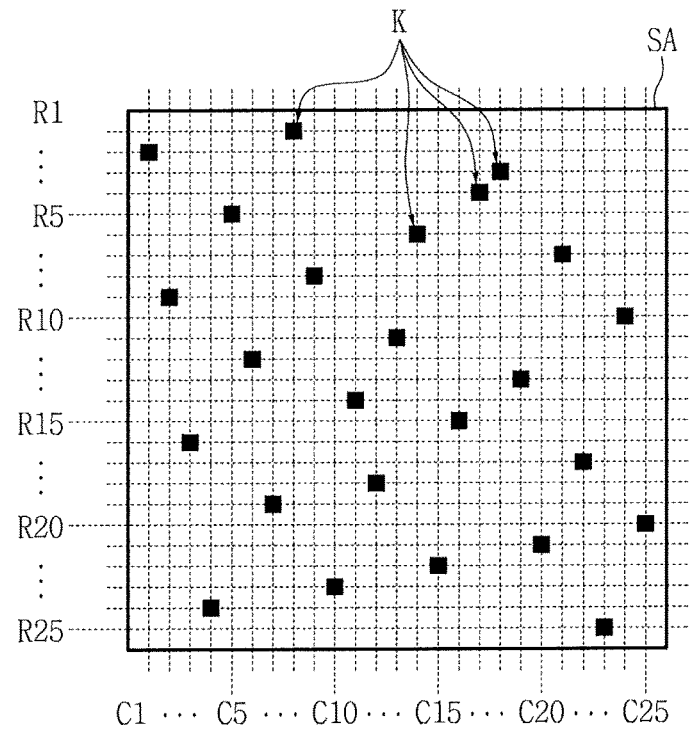
Figure 4A:
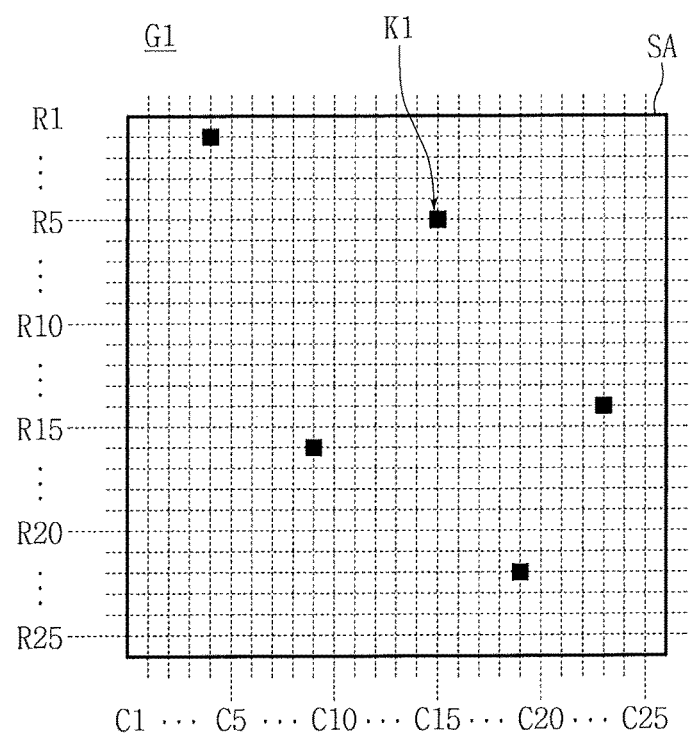
FIGS. 4A to 4E are views showing a state in which overlay keys included in the shot area shown in FIG. 3A are grouped into a plurality of overlay coordinate groups.
Figure 4B:
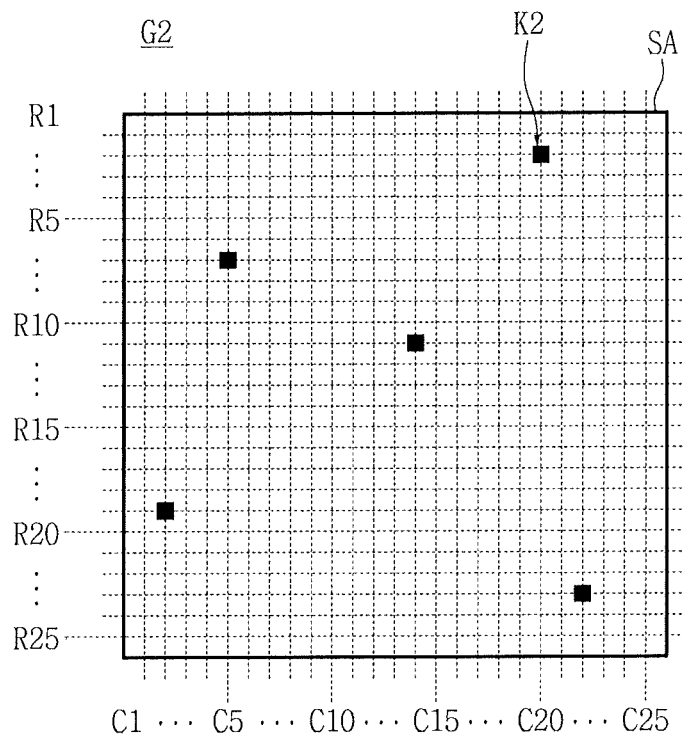
Figure 4C:
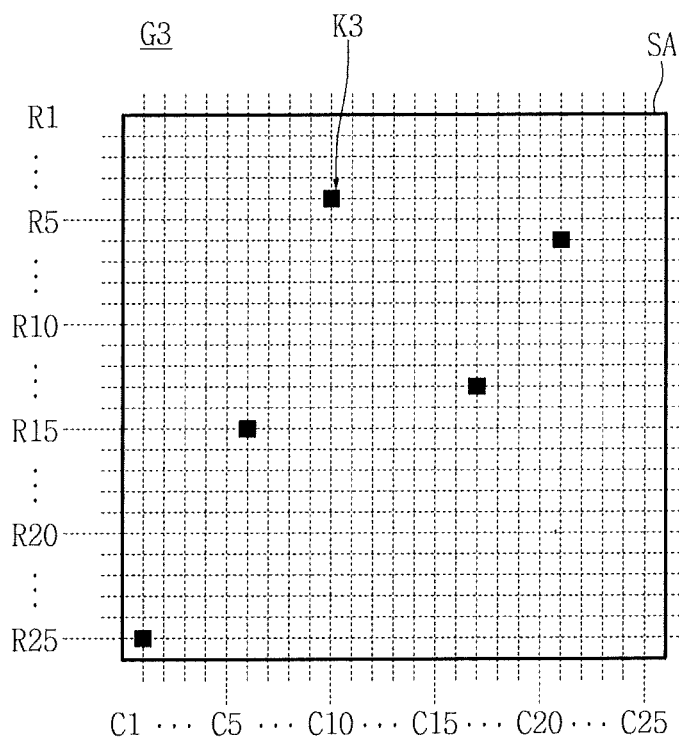
Figure 4D:
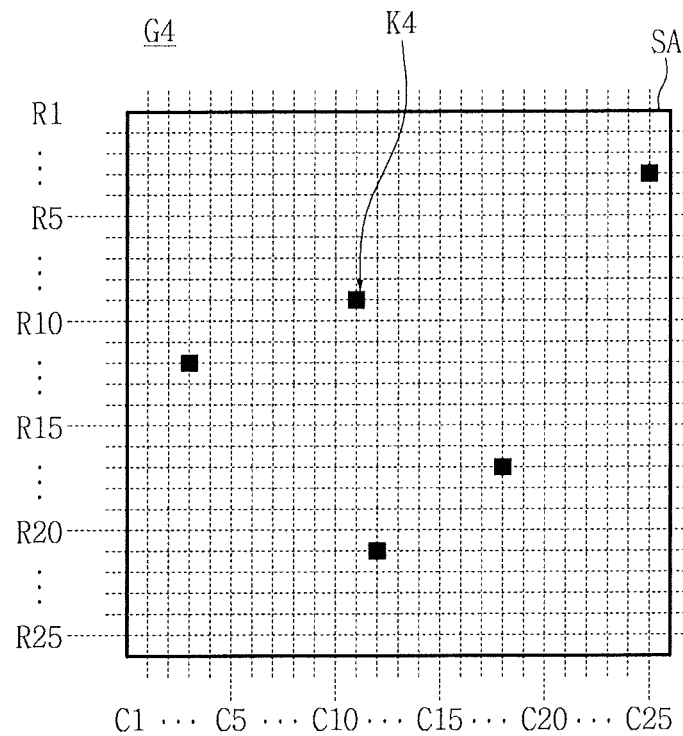
Figure 4E:
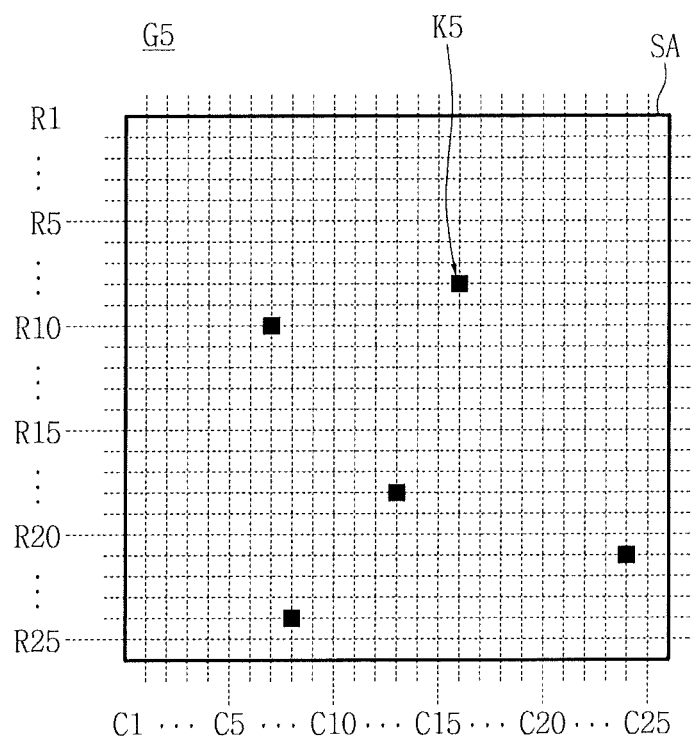
Figure 5A:
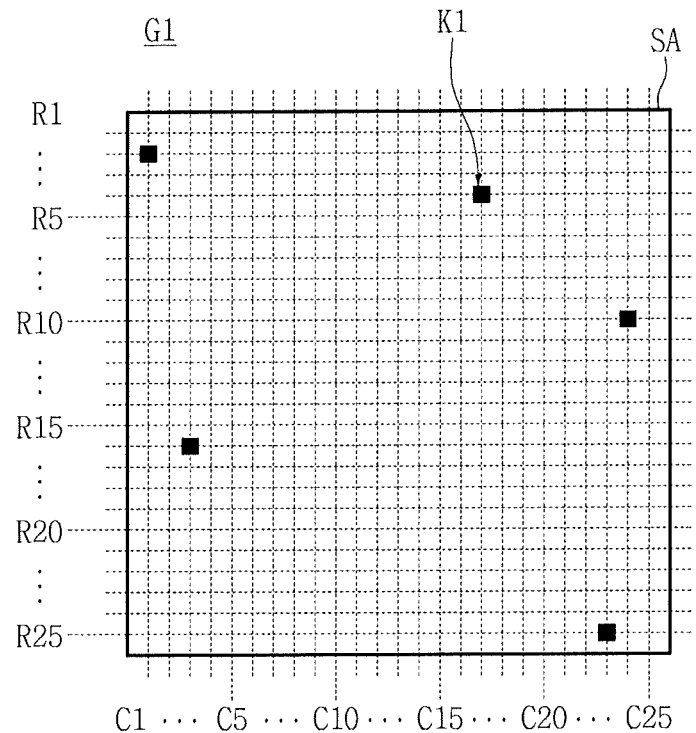
FIGS. 5A to 5E are views showing a state in which overlay keys included in the shot area shown in FIG. 3B are grouped into a plurality of overlay coordinate groups.
Figure 5B:
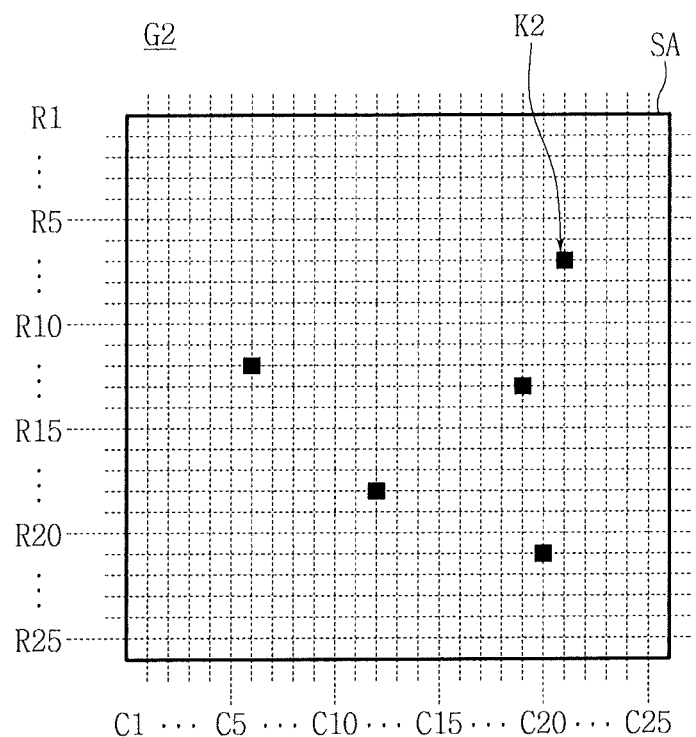
Figure 5C:
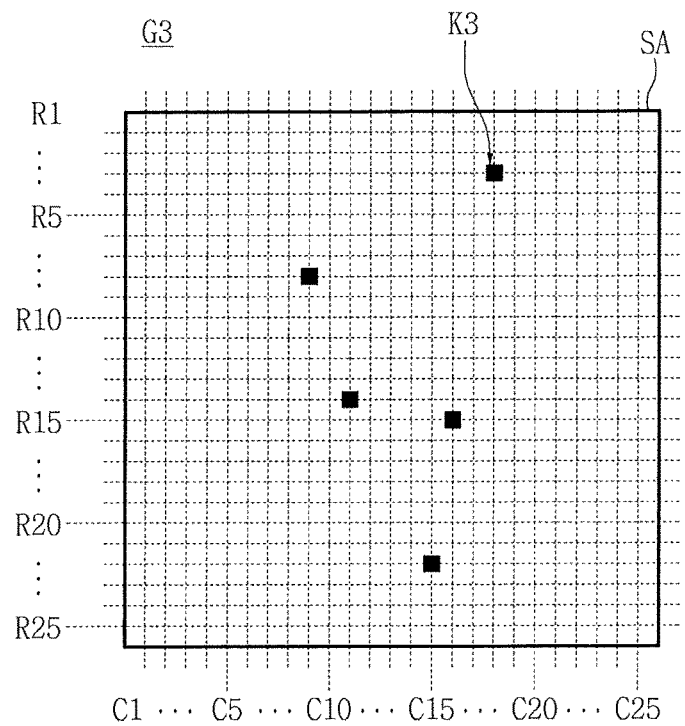
Figure 5D:
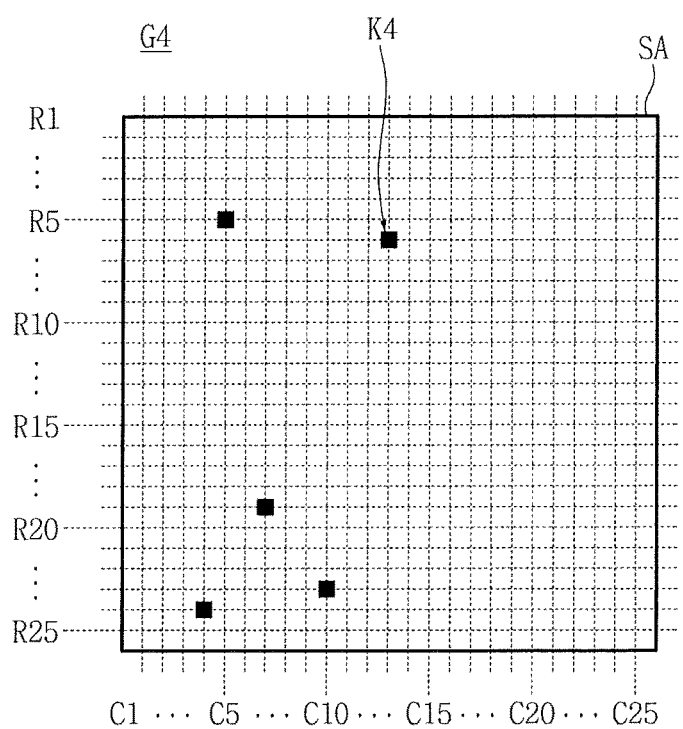
Figure 5E:
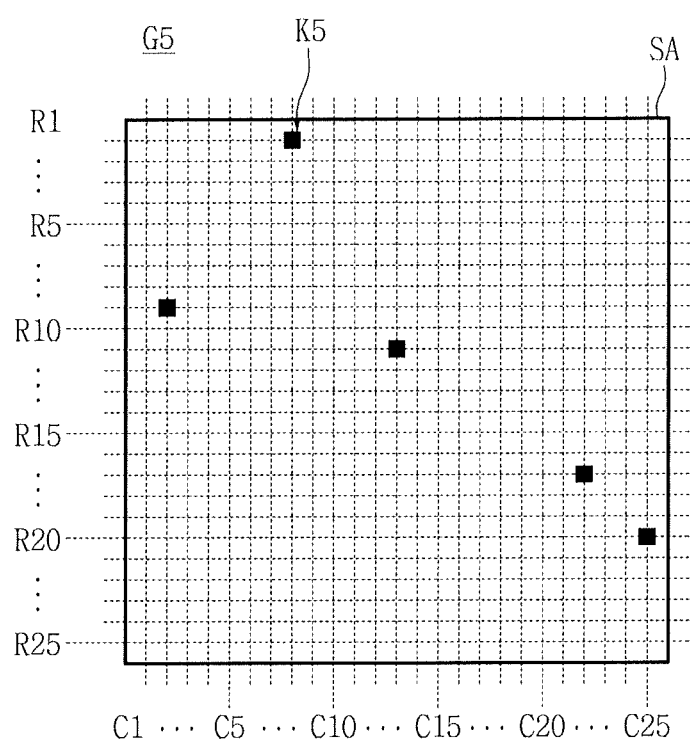
Figure 6A:
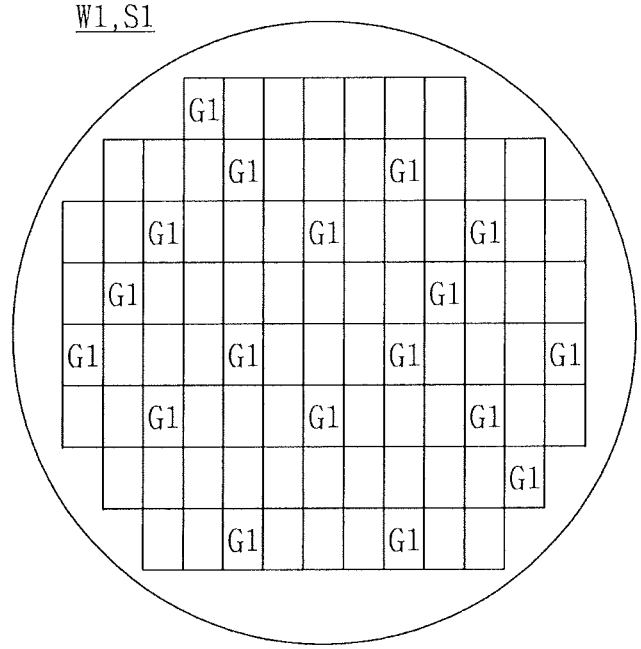
FIGS. 6A to 6E are views showing shot area groups in which overlay keys of first to fifth overlay coordinate groups are measured on first to fifth wafers.
Figure 6B:
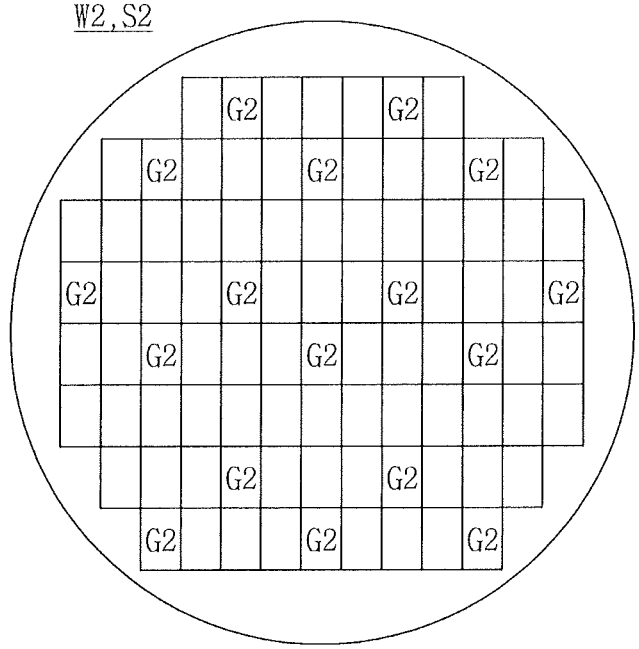
Figure 6C:
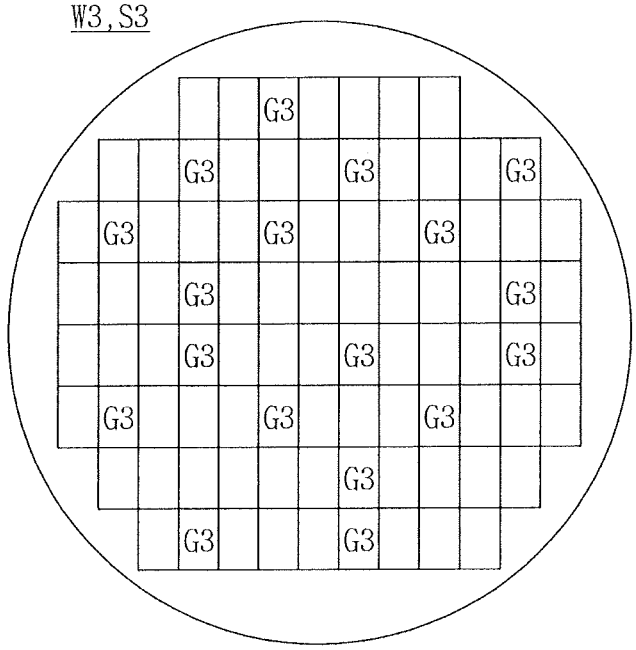
Figure 6D:
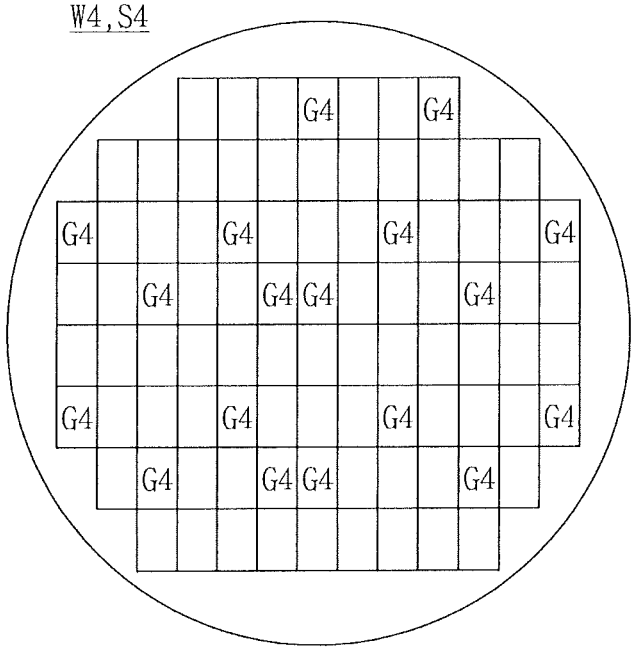
Figure 6E:
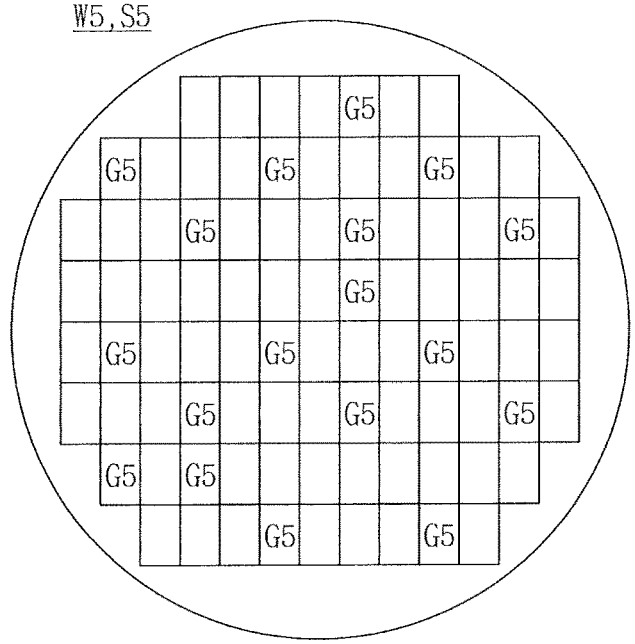

FIGS. 3A and 3B are enlarged views showing shot areas SA of the wafers W shown in FIGS. 2A and 2B. Referring to FIGS. 3A and 3B, each of the shot areas SA of the wafers W may include overlay keys K disposed on a plurality of overlay coordinates. In exemplary embodiments in accordance with principles of inventive concepts, the overlay coordinates may be uniformly arranged to have rows R1 to R25 and columns C1 to C25 in the shot area SA. For example, each of the overlay keys K may be exclusively disposed at intersection points of the rows Rx and columns Cy. That is, by exclusively disposed, we mean that overlay keys do not share rows or columns; there is only one overlay key in column 1, only one overlay key in column 2, only one overlay key in column 3, . . . , only one overlay key in row 1, only one overlay key in row 2, only one overlay key in row 3, . . . etc. In exemplary embodiments, it is assumed that one of the shot areas SA includes 25 overlay keys K. That is, because the number of the rows Rx and the number of columns Cy are each 25, a total of 25 overlay keys K are illustrated. In accordance with principles of inventive concepts, the overlay coordinates may be derived or extracted using a Latin hypercube sampling method. For example, the overlay coordinates may be wholly uniformly dispersed or distributed in the shot areas SA without bias. For example, the overlay coordinates may have maximized dispersion. The number of the rows Rx and the number of columns Cy may vary, and the number of the overlay keys K may correspondingly vary. In FIGS. 3A and 3B, dotted lines that indicate the rows Rx and columns Cy are virtual lines. In exemplary embodiments overlay keys K may be disposed in the chip areas in the shot areas SA rather than in the scribe lane and, as a result, overlay errors of the overlay keys K may be closer to actual overlay errors than if the overlay keys K were disposed in the scribe lanes.

FIGS. 4A to 4E are views showing an embodiment in which the overlay keys K included in the shot area SA shown in FIG. 3A are grouped into a plurality of overlay coordinate groups G1 to G5. FIGS. 5A to 5E are views showing an embodiment in which the overlay keys K included in the shot area SA shown in FIG. 3B are grouped into a plurality of overlay coordinate groups G1 to G5. In these exemplary embodiments the overlay coordinates will be described to be grouped into five overlay coordinate groups G1 to G5.

The overlay coordinates may be randomly or regularly grouped. For example, determined overlay coordinates of the overlay keys K may be regularly sampled (that is, sampled according to a layout scheme, for example) and grouped into the first to fifth overlay coordinate groups G1 to G5. Alternatively, the overlay coordinates may be randomly sampled and grouped into the overlay coordinate groups G1 to G5 in a variety of ways.

The overlay coordinates may be exclusively grouped (that is, each coordinate may belong to only one group). For example, each of the overlay coordinates may be exclusively included in one (that is, in one and only one) of the first to fifth overlay coordinate groups G1 to G5. In exemplary embodiments, when all overlay coordinates of the overlay coordinate groups G1 to G5 are collected, the entire overlay coordinates shown in FIGS. 2A and/or 3B may be formed. In exemplary embodiments, the overlay coordinate groups G1 to G5 each include the same number of the overlay coordinates. For example, when the number of the overlay coordinates disposed in one shot area SA is 25, the overlay coordinate groups G1 to G5 may each include five overlay coordinates.

FIGS. 6A to 6E are views showing exemplary embodiments of shot area groups S1 to S5 in which the overlay keys K of the first to fifth overlay coordinate groups G1 to G5 are measured on the first to fifth wafers W1 to W5 in accordance with principles of inventive concepts. Referring to FIGS. 6A to 6E, the overlay keys K of the first overlay coordinate group G1 may be measured in the first shot area group S1 of the first wafer W1, the overlay keys K of the second overlay coordinate group G2 may be measured in the second shot area group S2 of the second wafer W2, the overlay keys K of the third overlay coordinate group G3 may be measured in the third shot area group S3 of the third wafer W3, the overlay keys K of the fourth overlay coordinate group G4 may be measured in the fourth shot area group S4 of the fourth wafer W4, and the overlay keys K of the fifth overlay coordinate group G5 may be measured in the fifth shot area group S5 of the fifth wafer W5. In exemplary embodiments in accordance with principles of inventive concepts, the shot areas SA of the first to fifth wafers W1 to W5 do not overlap and no shot area SA is omitted.

The first wafer W1 may be one selected from the first wafer group L1, the second wafer W2 may be one selected from the second wafer group L2, the third wafer W3 may be one selected from the third wafer group L3, the fourth wafer W4 may be one selected from the fourth wafer group L4, and the fifth wafer W5 may be one selected from the fifth wafer group L5, for example.

Figure 7:
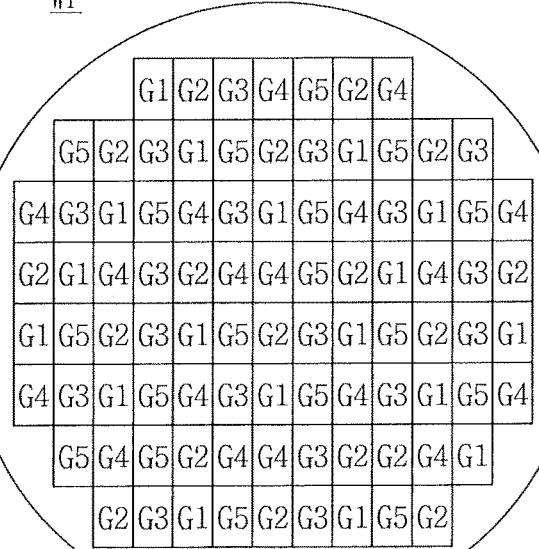
FIG. 7 is a view showing a state in which first to fifth shot area groups, in which the overlay keys of the first to fifth overlay coordinate groups measured on the first to fifth wafers, respectively, are measured, are shown on one representative wafer.

FIG. 7 is a view showing an exemplary embodiment in which the first to fifth shot area groups S1 to S5, in which the overlay keys K of the first to fifth overlay coordinate groups G1 to G5 measured on the first to fifth wafers W1 to W5, respectively, are measured, are shown on one representative wafer Wr. Referring to FIG. 7, the overlay keys K corresponding to the first to fifth overlay coordinate groups G1 to G5 may be selectively measured without overlap or omission within the entire shot areas SA.

FIGS. 8A to 8E are views of an exemplary embodiment showing overlay errors of the overlay keys K measured in the shot area groups S1 to S5 of the first to fifth overlay coordinate groups G1 to G5 on the first to fifth wafers W1 to W5 in accordance with principles of inventive concepts.

Figure 8A:
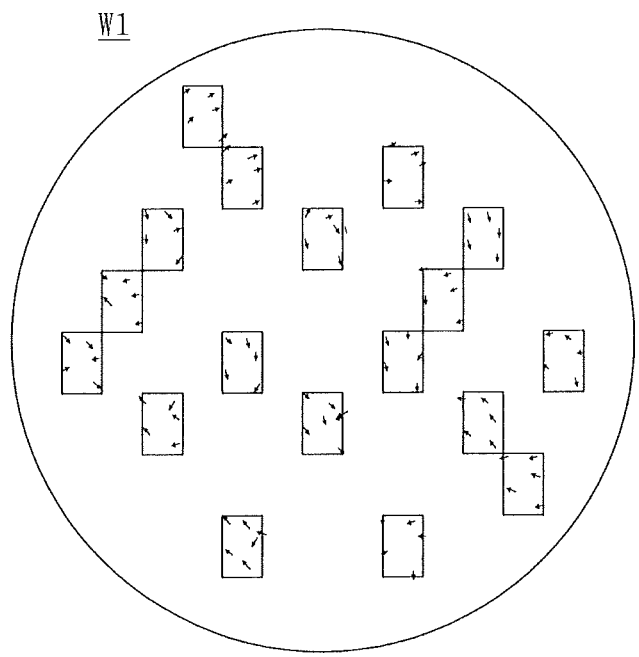
FIGS. 8A to 8E are views showing overlay errors in which the overlay keys in the shot area groups of the first to fifth overlay coordinate groups on the first to fifth wafers are measured.

Referring to FIGS. 1, 4A, 5A, 6A, and 8A, the method may include measuring the overlay keys K of the first wafer W1 (S110). In particular, the method may include measuring the overlay keys K of the first overlay coordinate group G1 of the first shot area group S1 of the first wafer W1 and generating first overlay error data. The first overlay error data is illustrated in FIG. 8A using arrows. The arrows may refer to vector values of the measured overlay errors of the overlay keys K. The method may include revising primarily (that is, first revising) first overlay correction data using the first overlay error data and generating primarily revised first overlay correction data (S115).

Figure 8B:
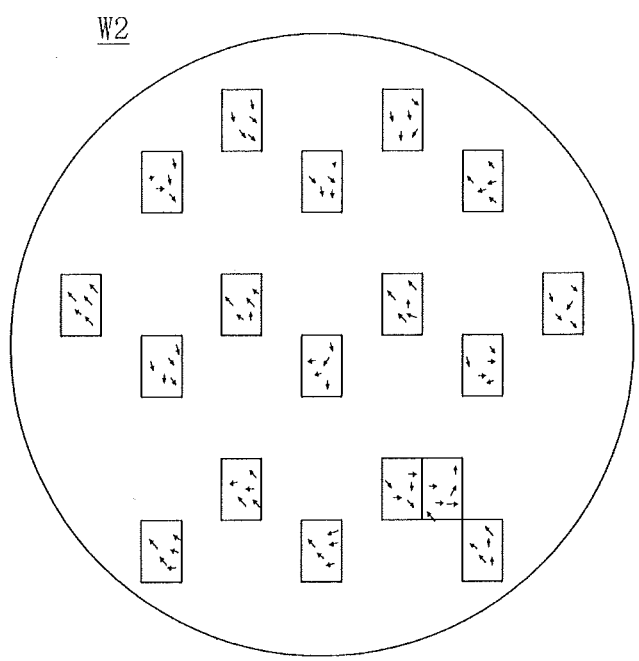
Figure 8C:
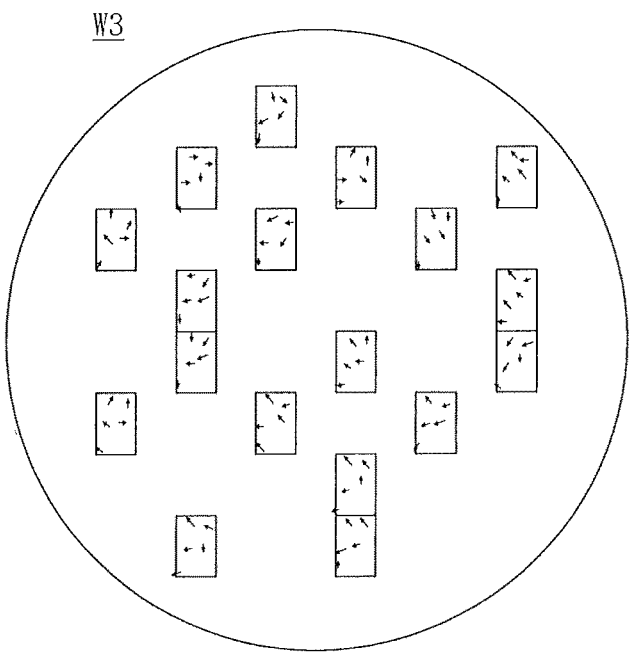

Referring to FIGS. 1, 4B, 5B, 6B, and 8B, the method may include measuring the overlay keys K of the second wafer W2 (S120). In particular, the method may include measuring the overlay keys K of the second overlay coordinate group G2 of the second shot area group S2 of the second wafer W2 and generating second overlay error data. The second overlay error data is illustrated in FIG. 8B using arrows. The method may include revising secondarily the primarily revised first overlay correction data based on the second overlay error data and generating secondarily revised first overlay correction data (S125).

Referring to FIGS. 1, 4C, 5C, 6C, and 8C, the method may include measuring the overlay keys K of the third wafer W3 (S130). In particular, the method may include measuring the overlay keys K of the third overlay coordinate group G3 of the third shot area group S3 of the third wafer W3 and generating third overlay error data. The third overlay error data is illustrated using arrows in 8C. The method may include revising tertiarily the secondarily revised first overlay correction data based on the third overlay error data and generating tertiarily revised first overlay correction data (S135).

Figure 8D:
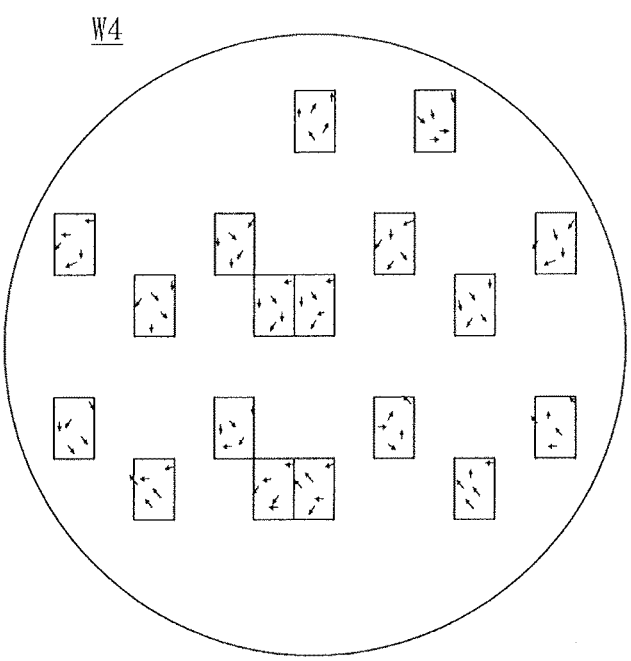

Referring to FIGS. 1, 4D, 5D, 6D, and 8D, the method may include measuring the overlay keys K of the fourth wafer W4 (S140). In particular the method may include measuring the overlay keys K of the fourth overlay coordinate group G4 of the fourth shot area group S4 of the fourth wafer W4 and generating fourth overlay error data. The fourth overlay error data is illustrated in FIG. 8D using arrows. The method may include revising quaternarily the tertiarily revised first overlay correction data based on the fourth overlay error data and generating quaternarily revised first overlay correction data (S145).

Figure 8E:
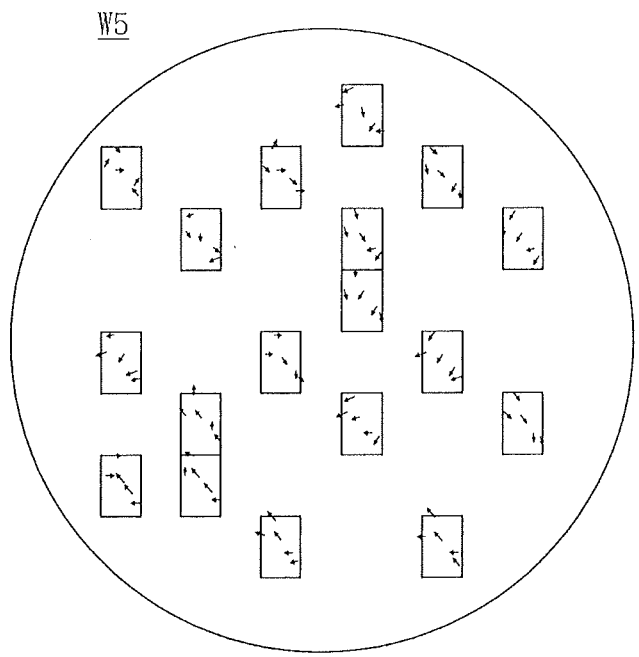

Referring to FIGS. 1, 4E, 5E, 6E, and 8E, the method may include measuring the overlay keys K of the fifth wafer W5 (S150). In particular, the method may include measuring the overlay keys K of the fifth overlay coordinate group G5 of the fifth shot area group S5 of the fifth wafer W5 and generating fifth overlay error data. The fifth overlay error data is illustrated in FIG. 8E using arrows. The method may include revising quinarily the quaternarily revised first overlay correction data based on the fifth overlay error data and generating second overlay correction data (S155).

Figure 9:
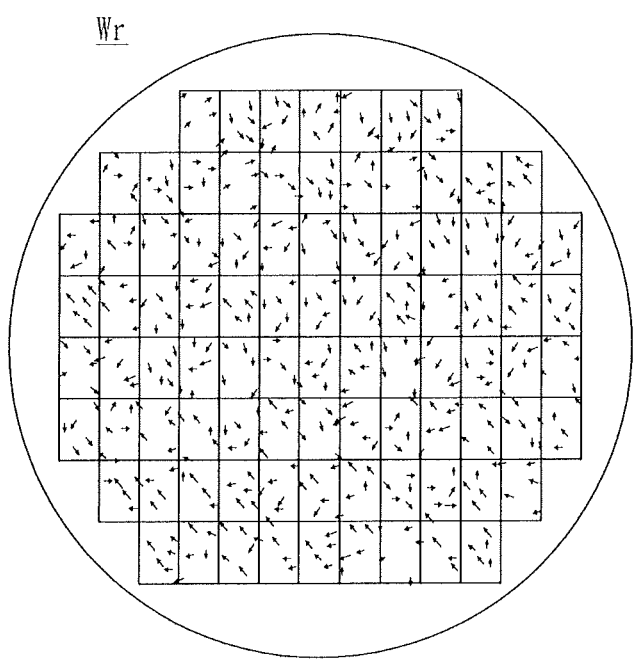
FIG. 9 is a view showing a state in which overlay errors, in which the overlay keys of the first to fifth overlay coordinate groups of the first to fifth shot area groups of the first to fifth wafers are measured, are shown on one representative wafer.
Figure 10A:
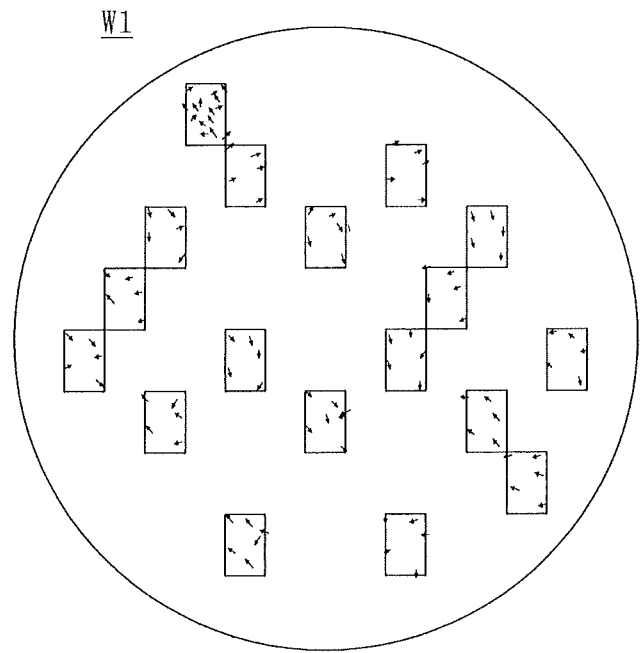
FIGS. 10A to 10E are views showing a state in which overlay errors, in which the overlay keys of the entire overlay coordinates of the first to fifth overlay coordinate groups in shot areas of one among the first to fifth shot area groups of the first to fifth wafers are measured, are shown on each of wafers.
Figure 10B:
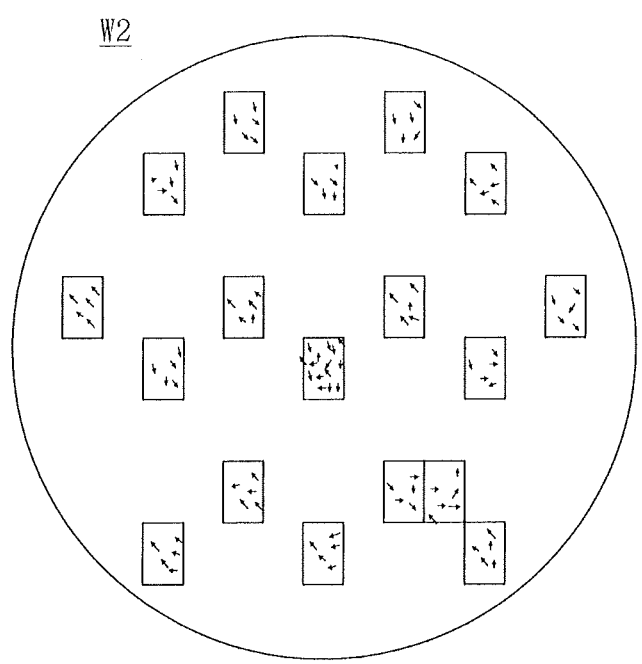
Figure 10C:
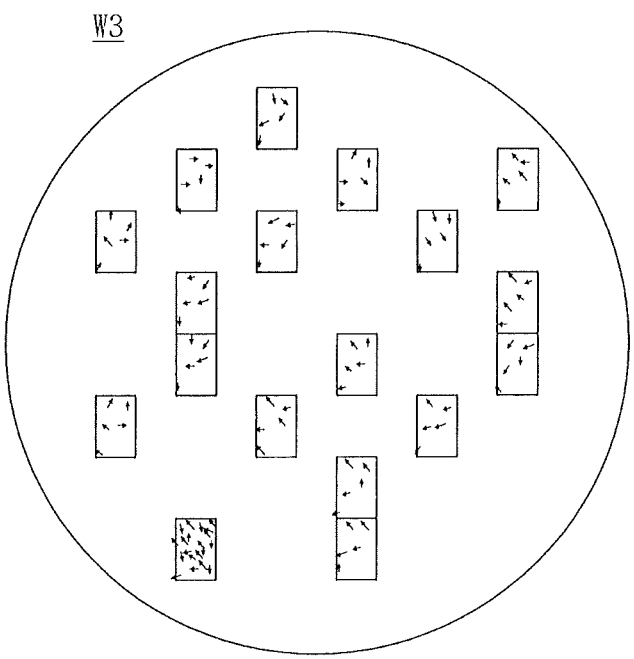
Figure 10D:
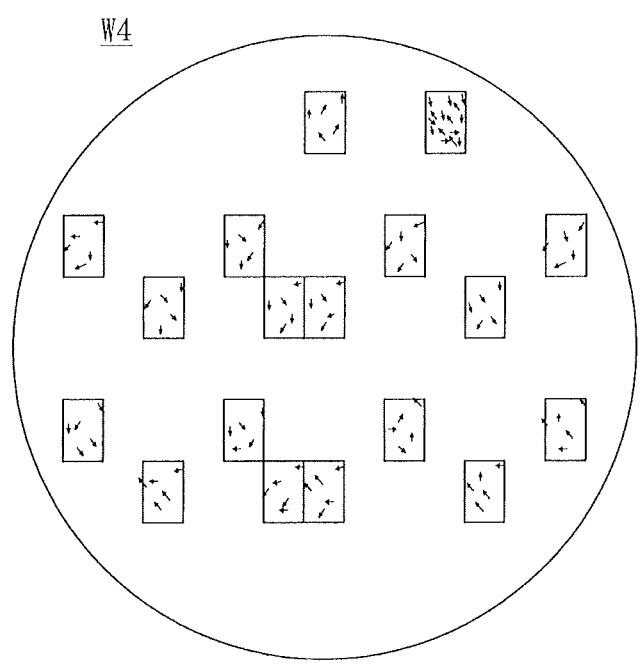
Figure 10E:
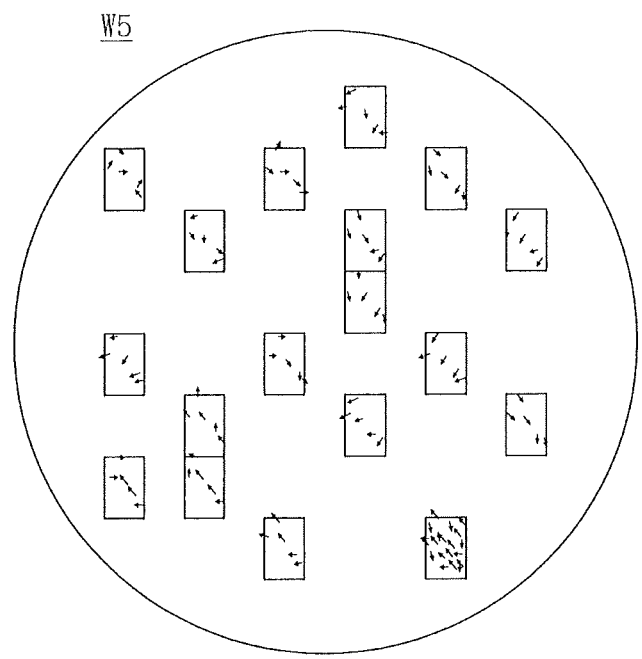

FIG. 9 is a view showing an exemplary embodiment of overlay error data in which the overlay keys K of the first to fifth overlay coordinate groups G1 to G5 of the first to fifth shot area groups S1 to S5 of the first to fifth wafers W1 to W5 are measured, are shown on one representative wafer Wr. The overlay errors have been measured in the entire shot areas SA without overlap or omission. The second overlay correction data may be generated by revising the first overlay correction data based on the overlay errors in the entire shot areas SA.

Then, the method may include preparing a second set of wafers W, and processing the second set of wafers W by performing a second photolithography process using the second overlay correction data (S160). In accordance with principles of inventive concepts, the method may include repetition of operations S110 to S160. The second set of wafers W may also include a plurality of wafer groups L1 to L5.

A method of revising overlay correction data in accordance with an embodiment of inventive concepts may include rearranging orders of the first to fifth wafers W1 to W5 shown in FIGS. 6A to 6E. In exemplary embodiments, the overlay keys K of the second overlay coordinate group G2 of the second shot area group S2 may be measured in the first wafer W1, the overlay keys K of the third overlay coordinate group G3 of the third shot area group S3 may be measured in the second wafer W2, the overlay keys K of the fourth overlay coordinate group G4 of the fourth shot area group S4 may be measured in the third wafer W3, the overlay keys K of the fifth overlay coordinate group G5 of the fifth shot area group S5 may be measured in the fourth wafer W4, and the overlay keys K of the first overlay coordinate group G1 of the first shot area group S1 may be measured in the fifth wafer W5. The orders may be regularly (shifted by one wafer, for example) or randomly changed in various ways.

A method of revising overlay correction data in accordance with an embodiment of inventive concepts may include selecting one to five shot areas SA, and measuring the overlay keys K of the entire overlay coordinate groups G1 to G5, that is, of all the overlay coordinate groups G1 to G5, in the first to fifth shot area groups S1 to S5 of the first to fifth wafers W1 to W5, respectively, shown in FIGS. 6A to 6E. For example, referring to FIGS. 10A to 10E, the overlay keys K of the entire overlay coordinate groups G1 to G5 may be measured in one shot area SA of the first shot area group S1 of the first wafer W1, the overlay keys K of the entire overlay coordinate groups G1 to G5 may be measured in one shot area SA of the second shot area group S2 of the second wafer W2, the overlay keys K of the entire overlay coordinate groups G1 to G5 may be measured in one shot area SA of the third shot area group S3 of the third wafer W3, the overlay keys K of the entire overlay coordinate groups G1 to G5 may be measured in one shot area SA of the fourth shot area group S4 of the fourth wafer W4, and the overlay keys K of the entire overlay coordinate groups G1 to G5 may be measured in one shot area SA of the fifth shot area group S5 of the fifth wafer W5.

Figure 11:
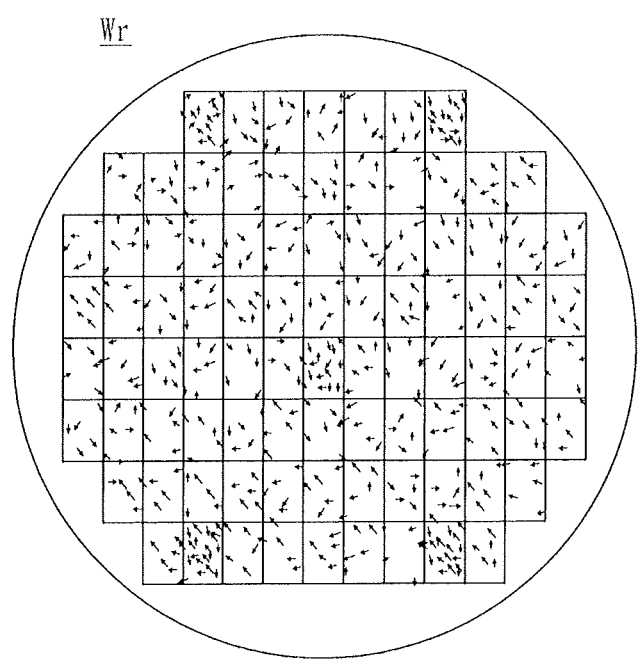
FIG. 11 is a view showing a state in which overlay errors, in which the overlay keys of the entire overlay coordinates of the first to fifth overlay coordinate groups in shot areas of one among the first to fifth shot area groups of the first to fifth wafers are measured, are shown on one representative wafer.

FIG. 11 is a view showing overlay errors, in which the overlay keys K of the entire overlay coordinates, that is, of all the overlay coordinates, of the first to fifth overlay coordinate groups G1 to G5 in shot areas SA of one among the first to fifth shot area groups S1 to S5 of the first to fifth wafers W1 to W5 are measured, are shown on one representative wafer Wr. The overlay keys K on the entire overlay coordinates have been measured so that five shot areas SA do not overlap one another.

In exemplary embodiments in accordance with principles of inventive concepts, overlay keys K may not be disposed in a scribe lane but, rather, may be disposed in a chip area. As a result, in accordance with principles of inventive concepts of inventive concepts, the overlay keys K may be measured at positions at which the overlay errors are exclusively and uniformly disposed in an on chip area and, because the overlay errors may be uniformly measured in whole without bias in predetermined areas, the overlay errors may be measured to be very close to an actual error.

A method of revising the overlay correction data in accordance with principles of inventive concepts may further include removing outliers from the first to fifth overlay error data before the second overlay correction data is generated. The outliers may be selected using an interpolation process, such as a Gaussian process regression, such as a Kriging method, for example. As a result, a method in accordance with principles of inventive concepts may include revising the first overlay correction data using the first to fifth overlay error data from which the outliers are removed and generating the second overlay correction data, for example.

The methods of revising the overlay correction data according to the embodiments of inventive concepts may be continuously performed.

In exemplary embodiments of inventive concepts, when the number of errors of the first overlay correction data is considered zero (0), the second overlay correction data may be initial overlay correction data. That is, exemplary embodiments in accordance with principles of inventive concepts may include generating initial overlay correction data.

According to exemplary embodiments in accordance with principles of inventive concepts, overlay keys may be disposed on the overlay coordinates which do not overlap or are not biased, and as a result, overall overlay tendency of wafers and shot areas can be identified.

According to exemplary embodiments of inventive concepts, an overall overlay tendency of wafers may be seen by measuring selected areas of a small number of wafers and overlay errors of overlay keys, and thus, productivity can be improved.

According to exemplary embodiments of inventive concepts, a process of measuring an overlay can be more precisely analyzed in less time, and thus, productivity can be improved.

According to exemplary embodiments of inventive concepts, overlay keys are disposed in a chip area, and, as a result, an overlay which is sensitive to a process change can be more precisely measured.

According to exemplary embodiments of inventive concepts, because an overlay arrangement capability is improved, the life of an existing photolithography apparatus can be extended, and thus, manufacturing costs of a semiconductor device can be reduced.

Although a few exemplary embodiments have been described with reference to the accompanying drawings, those skilled in the art will readily appreciate that many modifications are possible without departing from the scope of inventive concepts and without changing essential features. Therefore, the above-described embodiments should be understood in a descriptive sense only and not for purposes of limitation.

What is claimed is:

1. A method of revising overlay correction data, comprising:
    preparing a plurality of wafers each having a plurality of overlay coordinates in a plurality of shot areas, wherein the plurality of shot areas include mutually exclusive first and second shot area groups, the overlay coordinates include first and second mutually exclusive overlay coordinate groups, and the wafers include first and second mutually exclusive wafer groups;
    forming overlay keys on the overlay coordinates in the shot areas of the wafers by performing a photolithography process using first overlay correction data;
    selecting a first wafer from the first wafer group, measuring first overlay errors of the overlay keys on the first overlay coordinate group in the shot areas of the first shot area group on the first wafer, and performing a first revision of, or revising primarily, the first overlay correction data using the first overlay errors; and
    selecting a second wafer from the second wafer group, measuring second overlay errors of the overlay keys on the second overlay coordinate group in the shot areas of the second shot area group on the second wafer, and performing a second revision of, or revising secondarily, the primarily revised first overlay correction data using the second overlay errors.

2. The method of claim 1, wherein the first shot area group and the second shot area group include the shot areas which are mutually exclusive.

3. The method of claim 1, wherein each of the plurality of overlay coordinates is disposed at intersections on different rows and different columns.

4. The method of claim 3, wherein the plurality of overlay coordinates are uniformly disposed in the shot areas using a Latin hypercube sampling method so as to have a maximized dispersion without overlap or bias.

5. The method of claim 1, wherein:
    the plurality of shot areas further include a third shot area group exclusive from the first and second shot areas;
    the overlay coordinates further include a third overlay coordinate group exclusive from the first and second overlay coordinate groups;
    the wafers further include a third wafer group exclusive from the first and second wafer groups; and
    the method further includes selecting a third wafer from the third wafer group, measuring third overlay errors of the overlay keys on the third overlay coordinate group in the shot areas of the third shot area group, and performing a third revision of, or revising tertiarily, the secondarily revised first overlay correction data using the third overlay errors.

6. The method of claim 5, wherein:
    the plurality of shot areas further include a fourth shot area group exclusive from the first to third shot areas;
    the overlay coordinates further include a fourth overlay coordinate group exclusive from the first to third overlay coordinate groups;
    the wafers further include a fourth wafer group exclusive from the first to third wafer groups; and
    the method further includes selecting a fourth wafer from the fourth wafer group, measuring fourth overlay errors of the overlay keys on the fourth overlay coordinate group in the shot areas of the fourth shot area group, and performing a fourth revision of, or revising quaternarily, the tertiarily revised first overlay correction data using the fourth overlay errors.

7. The method of claim 6, wherein:
    the plurality of shot areas further include a fifth shot area group exclusive from the first to fourth shot areas;
    the overlay coordinates further include a fifth overlay coordinate group exclusive from the first to fourth overlay coordinate groups;
    the wafers further include a fifth wafer group exclusive from the first to fourth wafer groups; and
    the method further includes selecting a fifth wafer from the fifth wafer group, measuring fifth overlay errors of the overlay keys on the fifth overlay coordinate group in the shot areas of the fifth shot area group, performing a fifth revision of, or revising quinarily, the quaternarily revised first overlay correction data using the fifth overlay errors, and generating second overlay correction data.

8. The method of claim 7, wherein the first to fifth wafer groups each include one lot of wafers and the first to fifth wafers each are each selected from the one lot of wafers.

9. The method of claim 7, wherein a sum of the first to fifth shot areas includes all the shot areas on the wafers.

10. The method of claim 7, wherein a sum of the first to fifth overlay coordinate groups includes all the overlay coordinates in the entire shot areas.

11. A method of revising overlay correction data, comprising:
    forming a plurality of overlay keys on a first set of wafers using first overlay correction data;
    measuring first overlay keys formed on first overlay coordinates in a first shot area of a first wafer among the first set of wafers, generating first overlay error data, and revising primarily, or firstly revising, the first overlay correction data using the first overlay error data;

measuring second overlay keys formed on second overlay coordinates in a second shot area of a second wafer among the first set of wafers, generating second overlay error data, and revising secondarily, or secondly revising, the primarily revised first overlay correction data using the second overlay error data; and measuring third overlay keys formed on third overlay coordinates in a third shot area of a third wafer among the first set of wafers, generating third overlay error data, revising tertiarily, or thirdly revising, the secondarily revised first overlay correction data, and generating second overlay correction data, wherein the first overlay coordinates, the second overlay coordinates, and the third overlay coordinates are mutually exclusive.

12. The method of claim 11, wherein:

the first wafer is one in a first wafer group having a plurality of wafers;

the second wafer is one in a second wafer group having a plurality of wafers; and the third wafer is one in a third wafer group having a plurality of wafers.

13. The method of claim 11, wherein the first shot area, the second shot area, and the third shot area are mutually exclusive.

14. The method of claim 11, further comprising excluding outliers from each overlay error data using Kriging method before the second overlay correction data is generated.

15. The method of claim 11, further comprising:

measuring fourth overlay keys formed on fourth overlay coordinates in a fourth shot area of a fourth wafer among the first set of wafers, generating fourth overlay error data, and revising quaternarily, or fourthly revising on, the tertiarily revised first overlay correction data using the fourth overlay error data; and measuring fifth overlay keys formed on fifth overlay coordinates in a fifth shot area of a fifth wafer among the first set of wafers, generating fifth overlay error data, revising quinarily, or fifthly revising on, the quaternarily revised first overlay correction data using the fifth overlay error data, and generating the second overlay correction data, wherein the first overlay coordinates to the fifth overlay coordinates are mutually exclusive.

* * * * *